United States Patent
Qi et al.

(10) Patent No.: US 10,211,317 B1
(45) Date of Patent: Feb. 19, 2019

(54) VERTICAL-TRANSPORT FIELD-EFFECT TRANSISTORS WITH AN ETCHED-THROUGH SOURCE/DRAIN CAVITY

(71) Applicant: GLOBALFOUNDRIES Inc., Grand Cayman (KY)

(72) Inventors: Yi Qi, Niskayuna, NY (US); Xusheng Wu, Ballston Lake, NY (US); Jianwei Peng, Latham, NY (US); Sipeng Gu, Clifton Park, NY (US); Hsien-Ching Lo, Clifton Park, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 0 days.

(21) Appl. No.: 15/869,349

(22) Filed: Jan. 12, 2018

Related U.S. Application Data

(63) Continuation-in-part of application No. 15/676,300, filed on Aug. 14, 2017.

(51) Int. Cl.
| | |
|---|---|
| *H01L 29/76* | (2006.01) |
| *H01L 29/66* | (2006.01) |
| *H01L 29/10* | (2006.01) |
| *H01L 29/08* | (2006.01) |
| *H01L 29/06* | (2006.01) |
| *H01L 21/762* | (2006.01) |
| *H01L 21/311* | (2006.01) |
| *H01L 21/02* | (2006.01) |

(Continued)

(52) U.S. Cl.
CPC .. *H01L 29/66666* (2013.01); *H01L 21/02636* (2013.01); *H01L 21/31116* (2013.01); *H01L 21/31144* (2013.01); *H01L 21/76224* (2013.01); *H01L 29/0649* (2013.01); *H01L 29/0847* (2013.01); *H01L 29/1037* (2013.01); *H01L 29/6656* (2013.01); *H01L 29/7827* (2013.01); *H01L 21/0217* (2013.01); *H01L 21/0228* (2013.01); *H01L 21/02126* (2013.01); *H01L 21/31053* (2013.01)

(58) Field of Classification Search
CPC ......... H01L 29/66666; H01L 21/02532; H01L 21/02573; H01L 23/535; H01L 29/0847; H01L 29/7827; H01L 21/02381; H01L 27/11273; H01L 27/2454; H01L 21/3116; H01L 21/3114; H01L 21/76224; H01L 21/02636; H01L 21/76805; H01L 21/76895

See application file for complete search history.

(56) References Cited

U.S. PATENT DOCUMENTS

| | | |
|---|---|---|
| 5,817,562 A | 10/1998 | Chang et al. |
| 6,977,601 B1 | 12/2005 | Fletcher et al. |
| 7,211,864 B2 | 5/2007 | Seliskar |

(Continued)

*Primary Examiner* — Shahed Ahmed
(74) *Attorney, Agent, or Firm* — Thompson Hine LLP; Anthony Canale

(57) ABSTRACT

Methods of forming a structure for a vertical-transport field-effect transistor. A semiconductor fin is formed over a sacrificial layer. A support structure is connected with the semiconductor fin. After forming the support structure, the sacrificial layer is removed to form a cavity extending beneath the semiconductor fin. A semiconductor material is epitaxially grown in the cavity to form a source/drain region of the vertical-transport field-effect transistor.

20 Claims, 11 Drawing Sheets

(51) Int. Cl.
H01L 29/78 (2006.01)
H01L 21/3105 (2006.01)

(56) References Cited

U.S. PATENT DOCUMENTS

| | | |
|---|---|---|
| 7,714,384 B2 | 5/2010 | Seliskar |
| 8,273,617 B2 | 9/2012 | Thompson et al. |
| 9,349,868 B1 | 5/2016 | Balakrishnan et al. |
| 9,385,218 B1 | 7/2016 | Cheng et al. |
| 9,466,702 B1 | 10/2016 | Balakrishnan et al. |
| 9,748,380 B1 * | 8/2017 | Lie ................. H01L 29/7827 |

* cited by examiner

US 10,211,317 B1

VERTICAL-TRANSPORT FIELD-EFFECT TRANSISTORS WITH AN ETCHED-THROUGH SOURCE/DRAIN CAVITY

CROSS-REFERENCE TO RELATED APPLICATIONS

This application is a continuation-in-part of application Ser. No. 15/676,300, filed Aug. 14, 2017, which is incorporated by reference herein in its entirety.

BACKGROUND

The present invention relates to semiconductor device fabrication and integrated circuits and, more specifically, to methods of forming a structure for a vertical-transport field-effect transistor.

Traditional complementary metal-oxide-semiconductor (CMOS) structures for a field-effect transistor include a source, a drain, a channel situated between the source and drain, and a gate electrode configured to respond to a gate voltage by selectively connecting the source and drain to each other through the channel. Field-effect transistor structures can be broadly categorized based upon the orientation of the channel relative to a surface of a semiconductor substrate associated with their formation.

Planar field-effect transistors and fin-type field-effect transistors constitute a category of transistor structures in which the flow of gated current in the channel is oriented in a horizontal direction parallel to the substrate surface. In a vertical-transport field-effect transistor, the source/drain regions are arranged at the top and bottom of a semiconductor fin or pillar. The direction of the gated current in the channel between the source region and the drain region is oriented generally perpendicular (i.e., vertical) to the substrate surface and parallel to the height of the semiconductor fin or pillar.

In conventional constructions for a vertical-transport field-effect transistor, the epitaxial semiconductor material constituting the bottom source/drain region may be grown over areas of the substrate surface between the semiconductor fins. However, the epitaxial semiconductor material of the bottom source/drain region cannot grow beneath the semiconductor fins.

SUMMARY

In an embodiment, a method includes forming a semiconductor fin over a sacrificial layer, and forming a support structure connected with the semiconductor fin. After forming the support structure, the sacrificial layer is removed to form a cavity extending beneath the semiconductor fin. A semiconductor material is epitaxially grown in the cavity to form a source/drain region of a vertical-transport field-effect transistor.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1B is a top view of the device structure in which FIG. 1 is taken generally along line 1-1 and FIG. 1A is taken generally along line 1A-1A.

FIG. 16B is a top view of the device structure in which FIG. 16 is taken generally along line 16-16 and FIG. 16A is taken generally along line 16A-16A.

FIG. 17B is a top view of the device structure in which FIG. 17 is taken generally along line 17-17 and FIG. 17A is taken generally along line 17A-17A.

DETAILED DESCRIPTION

Figure 1:
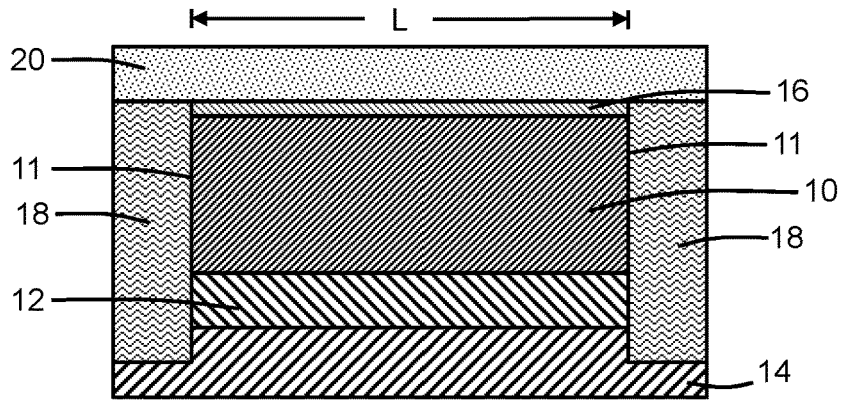
FIGS. 1-4 are cross-sectional views of a device structure at successive fabrication stages of a processing method in accordance with embodiments of the invention.
Figure 1A:
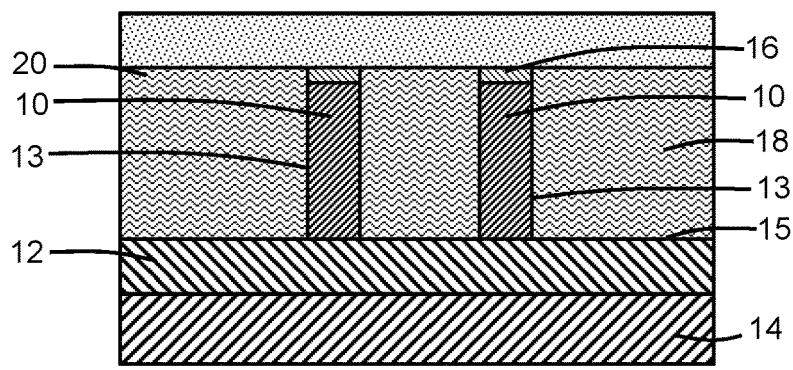
FIG. 1A is a cross-sectional view of the device structure of FIG. 1.
Figure 1B:
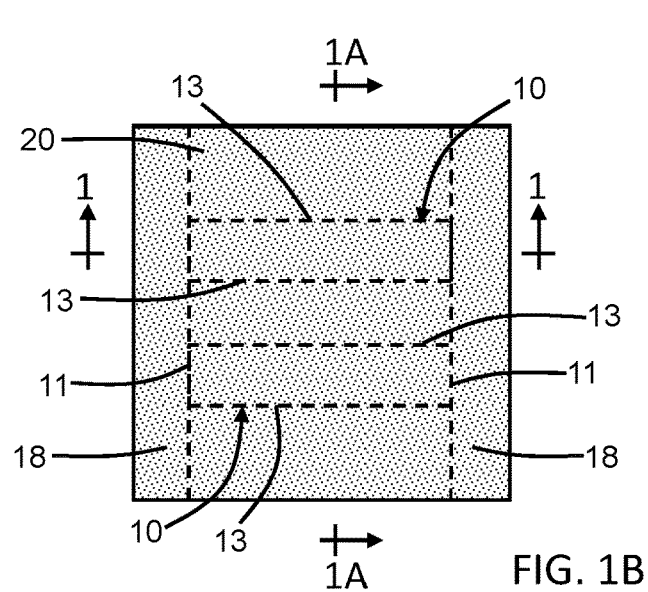

With reference to FIGS. 1, 1A, 1B and in accordance with embodiments of the invention, fins 10 project in a vertical direction from a top surface 15 of a sacrificial layer 12 that is formed on a substrate 14, such as a bulk single-crystal silicon substrate. The fins 10 are three-dimensional bodies composed of a semiconductor material, such as undoped or intrinsic silicon. The fins 10 include sidewalls 13 that project in a vertical direction relative to the top surface 15 of the sacrificial layer 12. The fins 10 may be formed from an epitaxial layer of, for example, intrinsic semiconductor material that is patterned using photolithography and etching processes, such as a sidewall imaging transfer (SIT) process or self-aligned double patterning (SADP). The fins 10 may be capped by a dielectric cap 16 that is composed of a dielectric material, such as silicon carbonitride (SiCN) or silicon nitride ($Si_3N_4$), and that may be a remnant of a hardmask from the patterning process. Alternatively, the dielectric cap 16 may be absent and/or removed from the fins 10.

The sacrificial layer 12 may be epitaxially grown using the substrate 14 as a growth seed, and the layer used to form the fins 10 may be epitaxially grown over the sacrificial layer 12 using the sacrificial layer 12 as a growth seed. The sacrificial layer 12 may be composed of a material, such as silicon-germanium (SiGe), that can be etched selective to the semiconductor material (e.g., silicon) of the fins 10 and to the semiconductor material of the substrate 14 (e.g., silicon). As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. Due to the difference in composition, the sacrificial layer 12 may operate as an etch stop during the patterning of the fins 10. In an embodiment, the sacrificial layer 12 may be composed of SiGe with a germanium content ranging from twenty-five percent (25%) to thirty-five percent (35%), which etches at a higher rate than silicon.

The fins 10 are cut to shorten their respective lengths, and are then embedded in a trench isolation layer 18 that may be composed of a dielectric material, such as an oxide of silicon (e.g., silicon dioxide ($SiO_2$)). The trench isolation layer 18 may be planarized by, for example, chemical mechanical polishing (CMP), to be coplanar with the top surface of the dielectric caps 16. The fins 10 include opposite end surfaces 11 located adjacent to the trench isolation layer 18 in a lengthwise direction. The opposite end surfaces 11 connect the opposite sidewalls 13 of the fins 10 and the connected set of end surfaces 11 and sidewalls 13 extend completely about the outer perimeter of each fin 10. The length of each fin 10 extends between the opposite end surfaces 11.

A sacrificial layer 20 is applied and patterned to form an etch mask that covers the fins 10 and overlaps with the trench isolation layer 18. The sacrificial layer 20 may be comprised of a silicon nitride ($Si_3N_4$), and may be patterned by lithography and etching to form the etch mask.

Figure 2:
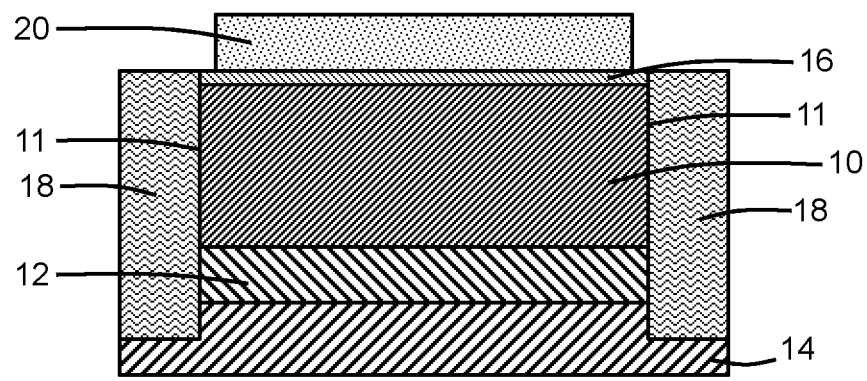

With reference to FIG. 2 in which like reference numerals refer to like features in FIG. 1 and at a subsequent fabrication stage, the sacrificial layer 20 is opened above the trench isolation layer 18 adjacent to the opposite end surfaces 11 of the fins 10, which exposes the trench isolation layer 18 adjacent to the end surfaces 11 of the fins 10. The trench isolation between the sidewalls 13 of the fins 10 remains covered by the sacrificial layer 20. The sacrificial layer 20 may be patterned to expose the trench isolation layer 18 adjacent to the end surfaces 11 of the fins 10 using photolithography and etching processes.

Figure 3:
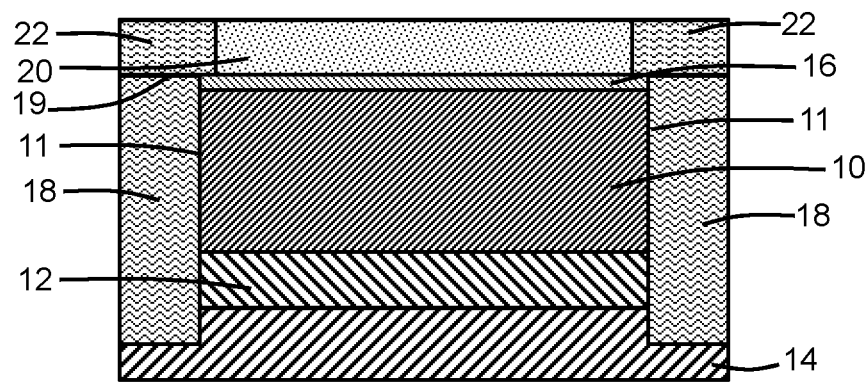

With reference to FIG. 3 in which like reference numerals refer to like features in FIG. 2 and at a subsequent fabrication stage, sections of a dielectric layer 22 are deposited on a top surface 19 of the exposed trench isolation layer 18 at the opposite end surfaces 11 of the fins 10. The dielectric layer 22 may be composed of a dielectric material, such as silicon dioxide ($SiO_2$) that is deposited by high-density plasma (HDP) deposition and that exhibits etch selectivity relative to the material of the sacrificial layer 20. The addition of the dielectric layer 22 increases the effective thickness of the trench isolation layer 18 adjacent to the opposite end surfaces 11 of the fins 10 in comparison to the thickness of the trench isolation layer 18 between the fins 10 and adjacent to the opposite sidewalls 13 of the fins 10.

Figure 4:
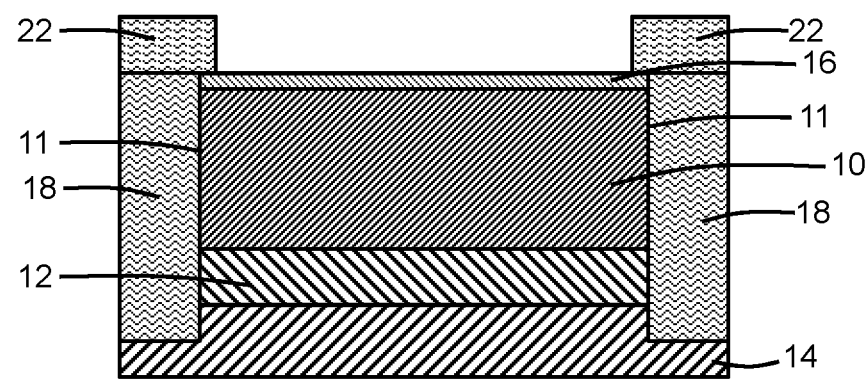

With reference to FIG. 4 in which like reference numerals refer to like features in FIG. 3 and at a subsequent fabrication stage, the sacrificial layer 20 is removed, which exposes the fins 10 and the trench isolation layer 18 between the fins 10. The sections of the dielectric layer 22 project from the top surface 19 of the trench isolation layer 18 above the top surface of the dielectric caps 16 and the top surface of the fins 10.

Figure 5:
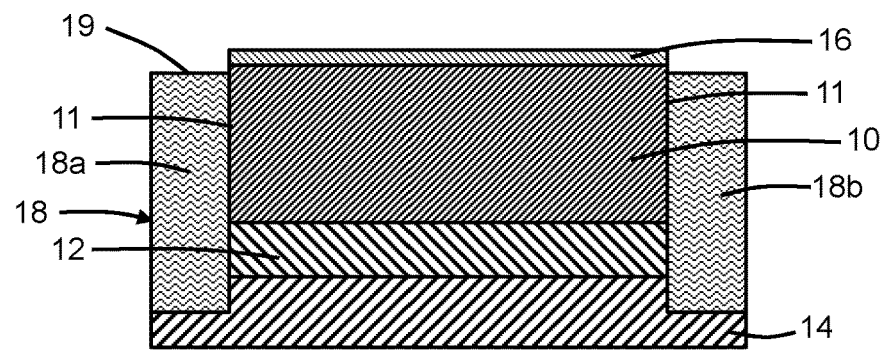
FIG. 5 is a cross-sectional view at a fabrication stage subsequent to FIG. 4.
Figure 5A:
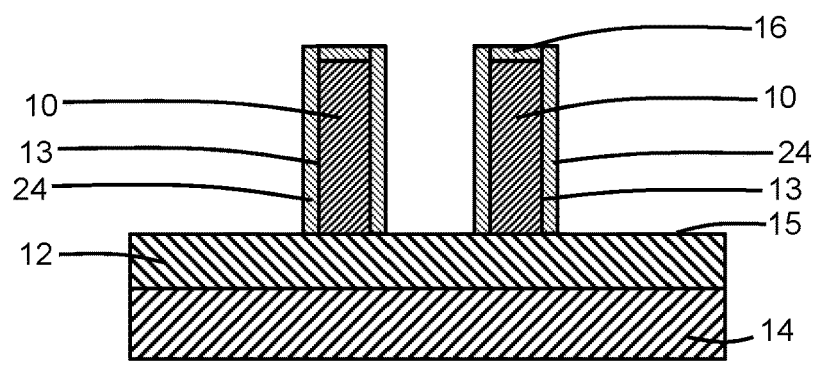
FIG. 5A is a cross-sectional view similar to FIG. 1A at the fabrication stage of FIG. 5.

With reference to FIGS. 5, 5A in which like reference numerals refer to like features in FIG. 4 and at a subsequent fabrication stage, an etching process is used to remove the trench isolation layer 18 adjacent to the sidewalls 13 of the fins 10 and between the fins 10. For example, the etching process may be a remote plasma-assisted dry etch process that involves the simultaneous exposure of the trench isolation layer 18 and dielectric layer 22 to $H_2$, $NF_3$ and $NH_3$ plasma by-products, and that removes the silicon dioxide of the trench isolation layer 18 and the dielectric layer 22 but does not readily etch silicon. The effective thickness added by the dielectric layer 22 at the opposite end surfaces 11 of the fins 10 results in sections 18a, 18b of the trench isolation layer 18 underneath the dielectric layer 22 being retained at each of the opposite end surfaces 11 of the fins 10 after the trench isolation layer 18 between sidewalls 13 of the fins 10 is completely removed.

Dielectric spacers 24 are formed at the sidewalls of the fins 10. The dielectric spacers 24 may be formed from a conformal dielectric layer using an anisotropic etching process, such as a reactive ion etching (RIE) process. The conformal dielectric layer may be composed of a dielectric material, such as silicon nitride ($Si_3N_4$), deposited by atomic layer deposition (ALD).

Figure 6:
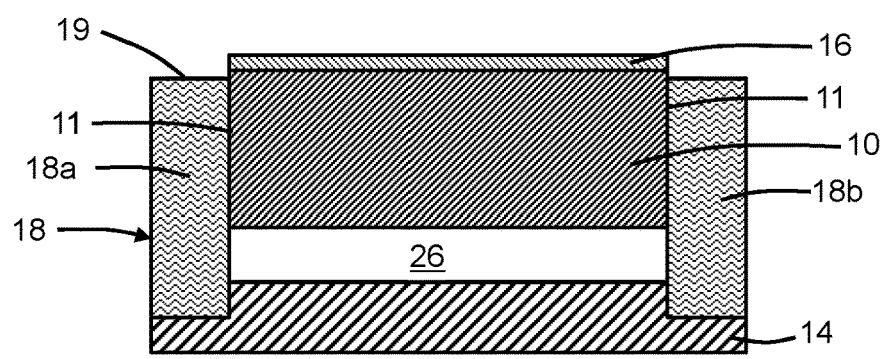
FIG. 6 is a cross-sectional view at a fabrication stage subsequent to FIG. 5.
Figure 6A:
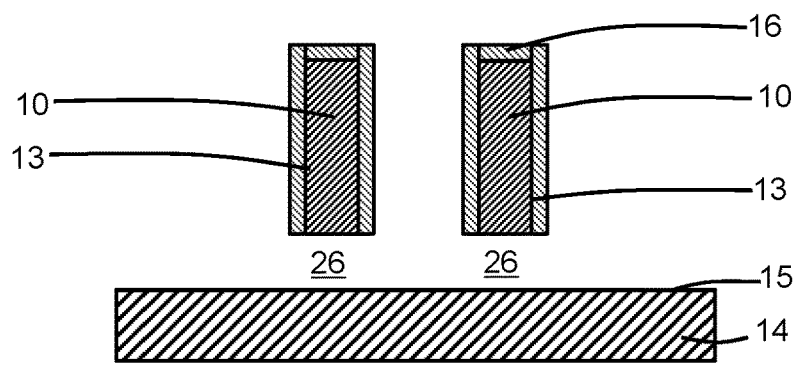
FIG. 6A is a cross-sectional view at a fabrication stage subsequent to FIG. 5A.

With reference to FIGS. 6, 6A in which like reference numerals refer to like features in FIGS. 5, 5A and at a subsequent fabrication stage, the sacrificial layer 12 is completely removed with an etching process that etches the material constituting the sacrificial layer 12 selective to the materials constituting the fins 10, substrate 14, and the sections 18a, 18b of trench isolation layer 18. The removal of the sacrificial layer 12 forms a cavity 26 that extends completely beneath the fins 10 and that is arranged vertically between respective bottoms of the fins 10 and a top surface of the substrate 14. The dielectric caps 16 and dielectric spacers 24 enhance the protection provided to the fins 10 during the removal of the sacrificial layer 12. The sections 18a, 18b of the trench isolation layer 18 at each of the opposite end surfaces 11 of the fins 10 provide a support structure that mechanically supports the fins 10 after the cavity 26 is formed that undercuts the fins 10. The fins 10 are suspended above the cavity 26 at their opposite end surfaces 11 by the sections 18a, 18b of the trench isolation layer 18.

Figure 7:
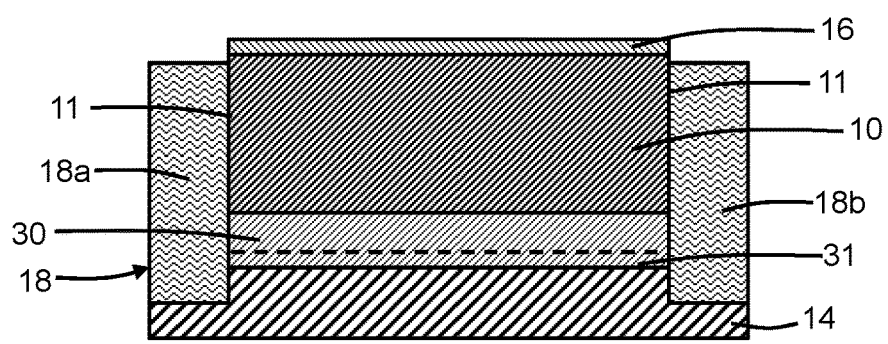
FIG. 7 is a cross-sectional view at a fabrication stage subsequent to FIG. 6.
Figure 7A:
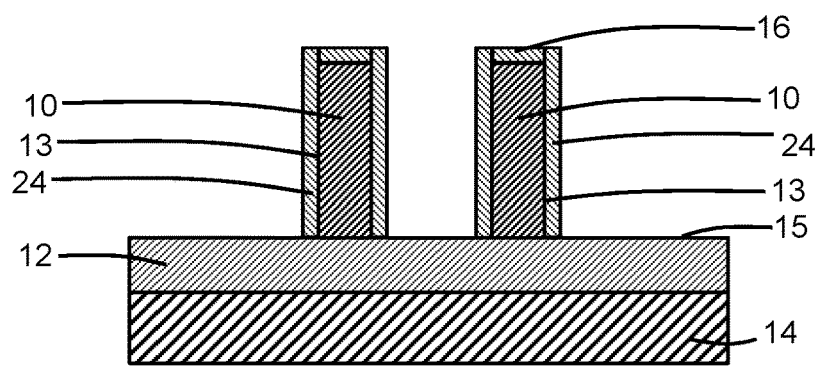
FIG. 7A is a cross-sectional view at a fabrication stage subsequent to FIG. 6A.

With reference to FIGS. 7, 7A in which like reference numerals refer to like features in FIGS. 6, 6A and at a subsequent fabrication stage, a bottom source/drain region 30 composed of a semiconductor material is formed in the cavity 26. The term "source/drain region" as used herein refers to a doped region of semiconductor material that can function as either a source or a drain of a field-effect transistor. The semiconductor material of the bottom source/drain region 30 has a volume equal to the volume of the cavity 26.

The semiconductor material of the bottom source/drain region 30 may be formed using an epitaxial growth process in which the single crystal semiconductor material of the substrate 14 serves as a growth seed for the epitaxial growth process. In an embodiment, the bottom source/drain region 30 may be formed by a selective epitaxial growth (SEG) process in which semiconductor material nucleates for epitaxial growth on semiconductor surfaces (e.g., the substrate 14 and the bottom surfaces of the fins 10), but does not nucleate for epitaxial growth from insulator surfaces (e.g., the dielectric caps 16 and dielectric spacers 24). In an embodiment, the bottom source/drain region 30 may be composed of single crystal silicon that has an epitaxial relationship with the substrate 14 and with the fins 10.

The bottom source/drain region 30 may be in situ doped during the epitaxial growth process to elevate its conductivity after dopant activation. In particular, the semiconductor material of the bottom source/drain region 30 may be heavily doped during epitaxial growth to have either p-type electrical conductivity or n-type electrical conductivity. The fins 10 and the bottom source/drain region 30 may be used to fabricate an n-type vertical-transport field-effect transistor, in which instance the bottom source/drain region 30 may be composed of silicon and may include a concentration of an n-type dopant from Group V of the Periodic Table (e.g., phosphorus (P) and/or arsenic (As)) that imparts n-type electrical conductivity to silicon. Alternatively, the fins 10 and the bottom source/drain region 30 may be used to fabricate a p-type vertical-transport field-effect transistor, in which instance, the bottom source/drain region 30 may be composed of silicon and may include a concentration of p-type dopant from Group III of the Periodic Table (e.g., boron (B), aluminum (Al), gallium (Ga), and/or indium (In)) that imparts p-type electrical conductivity to silicon.

In an embodiment, the semiconductor material of the bottom source/drain region 30 may be deposited as a multi-layer structure that further includes a buffer layer 31 as a dopant control buffer that is deposited on the substrate 14 before the heavily-doped section of the bottom source/drain region 30 is deposited on the buffer layer 31. The buffer layer 31, which may be undoped, may operate to alleviate or block dopant diffusion from the main section of the bottom source/drain region 30 to the substrate 14.

Forming the bottom source/drain region 30 with a replacement process that removes the sacrificial layer 12 to form the cavity 26 and replaces the sacrificial layer 12 with the epitaxially-grown semiconductor material of the bottom source/drain region 30 precisely places a uniformly-distributed dopant concentration directly over the portion of the volume of the semiconductor material of the bottom source/drain region 30 that is directly beneath the vertical channel of each of the fins 10. A consequence of the in situ doping during epitaxial growth is that the bottom source/drain region 30 may have a dopant concentration that is distributed uniformly over its entire volume, including the volume directly beneath the fins 10 and their vertical channels. The uniformity in the doping resulting from the replacement process contrasts with conventional processes in which ion implantation and a thermal drive-in are used to introduce dopant beneath the vertical channel of a fin. The dopant distribution produced by the conventional process inherently results in a dopant concentration that is not distributed uniformly over the entire volume of the substrate beneath the vertical channel of a fin.

Figure 8:
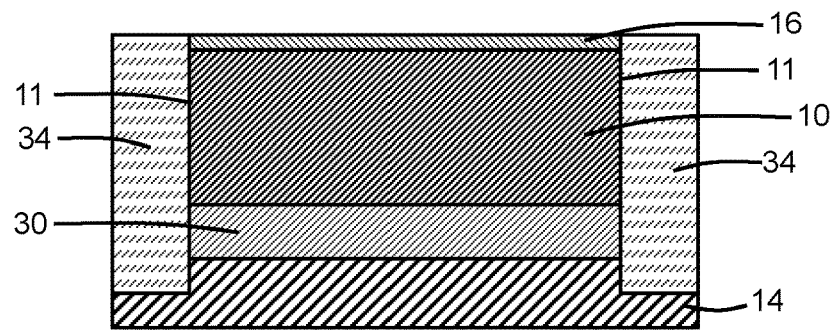
FIG. 8 is a cross-sectional view at a fabrication stage subsequent to FIG. 7.
Figure 8A:
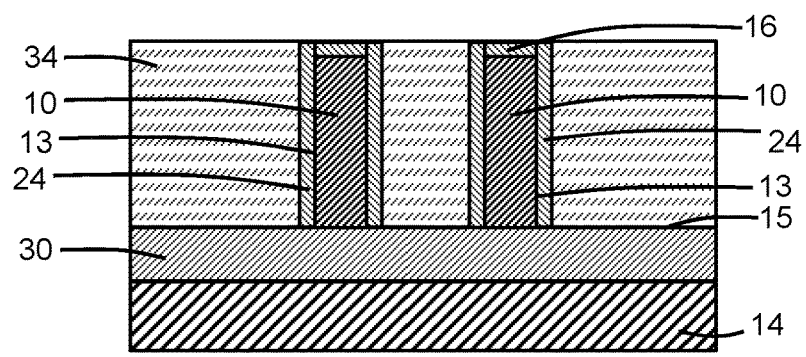
FIG. 8A is a cross-sectional view at a fabrication stage subsequent to FIG. 8.

With reference to FIGS. 8, 8A in which like reference numerals refer to like features in FIGS. 7, 7A and at a subsequent fabrication stage, the sections 18a, 18b of trench isolation layer 18 at the opposite end surfaces 11 of the fins 10 may be removed. An interlayer dielectric layer 34 is deposited and planarized using a chemical-mechanical polishing (CMP) process. The interlayer dielectric layer 34 may be composed of a dielectric material, such as silicon dioxide ($SiO_2$), silicon nitride ($Si_3N_4$), fluorine-doped silicon dioxide, or a combination of these and other dielectric materials. Portions of the interlayer dielectric layer 34 fill the trenches at the opposite end surfaces 11 of the fins 10 from which the trench isolation layer 18 was removed. Alternatively, the sections 18a, 18b of the trench isolation layer 18 may not be removed before forming the interlayer dielectric layer 34 and may be incorporated into the interlayer dielectric layer 34.

Figure 9:
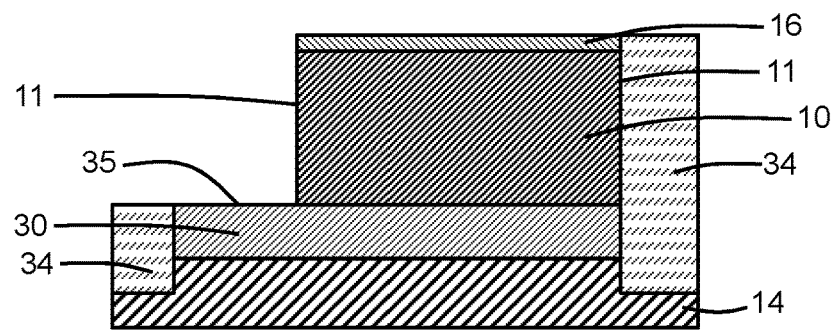
FIGS. 9-13 are cross-sectional views of the device structure at fabrication stages subsequent to FIG. 8.

With reference to FIG. 9 in which like reference numerals refer to like features in FIG. 8 and at a subsequent fabrication stage, the fins 10 may be cut at one end 11 using an etch mask and an etching process to remove a portion of the semiconductor material of the fins 10. An area 35 on the top surface of the bottom source/drain region 30 is exposed by the removal of portions of the fins 10, and portions of the interlayer dielectric layer 34 adjacent to the end surfaces 11 may also be removed. This exposed area 35 may be used to contact the bottom source/drain region 30.

Figure 10:
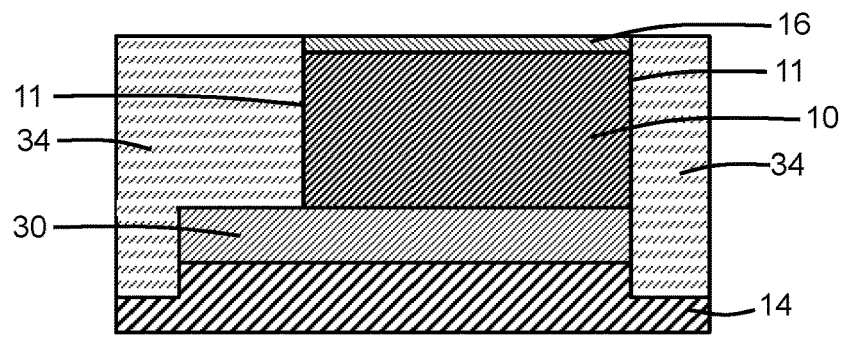

With reference to FIG. 10 in which like reference numerals refer to like features in FIG. 9 and at a subsequent fabrication stage, a dielectric material is deposited to fill the open space created by the fin cut in order to restore the thickness of the interlayer dielectric layer 34 surrounding the fins 10.

Figure 11:
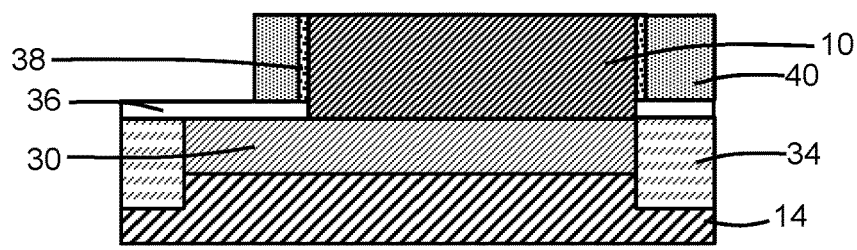

With reference to FIG. 11 in which like reference numerals refer to like features in FIG. 10 and at a subsequent fabrication stage, a bottom spacer layer 36 is formed on the bottom source/drain region 30. The bottom spacer layer 36 may be composed of a low-k dielectric material, such as silicon oxycarbonitride (SiOCN), deposited by ALD. A gate dielectric layer 38 and a gate stack 40 are formed that overlap with a central portion of the fins 10. The gate stack 40 is wrapped about each of the fins 10. The gate dielectric layer 38 may be composed of a dielectric material, such as a high-k dielectric having a dielectric constant (e.g., permittivity) greater than the dielectric constant of silicon dioxide ($SiO_2$). High-k dielectric materials suitable for the gate dielectric layer 38 include, but are not limited to, a hafnium-based dielectric material like hafnium oxide ($HfO_2$), a layered stack of a hafnium-based dielectric material and another dielectric material (e.g., aluminum oxide ($Al_2O_3$)), or combinations of these and other dielectric materials, deposited by ALD. The gate stack 40 may be composed of one or more barrier metal layers and/or work function metal layers, such as titanium aluminum carbide (TiAlC), titanium nitride (TiN), and/or tungsten (W), deposited by physical vapor deposition (PVD) or chemical vapor deposition (CVD).

Figure 12:
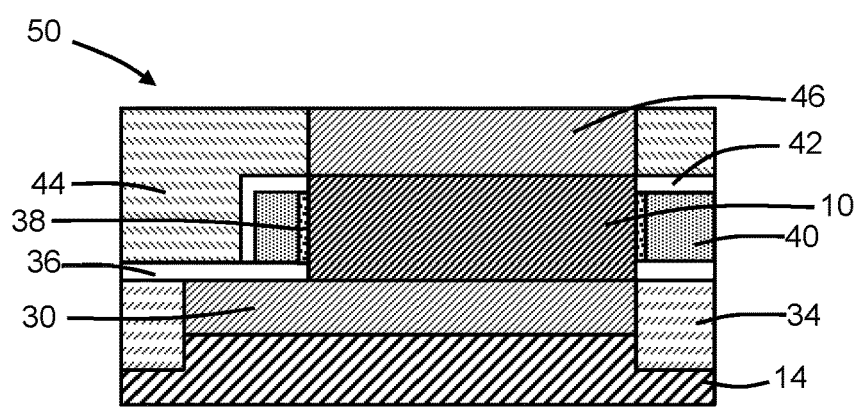

With reference to FIG. 12 in which like reference numerals refer to like features in FIG. 11 and at a subsequent fabrication stage, the gate dielectric layer 38 and gate stack 40 are recessed relative to the fins 10. A spacer layer 42 is formed that coats the gate stack 40. The spacer layer 42 may be composed of a low-k dielectric material, such as silicon oxycarbonitride (SiOCN), deposited by ALD. A dielectric layer 44 is formed that covers the spacer layers 36, 42. The dielectric layer 44 may be composed of a dielectric material, such as silicon dioxide ($SiO_2$), deposited by ALD. The dielectric caps 16 are removed and top source/drain regions 46 are formed in the open spaces vacated by the removed dielectric caps 16. Each top source/drain region 46 is coupled with the top surface of one of the fins 10. The spacer layer 42 is arranged vertically between the top source/drain regions 46 and the gate stack 40 to provide electric isolation.

The top source/drain regions 46 may be an epitaxial layer of semiconductor material formed by an epitaxial growth process with in-situ doping and the single-crystal semiconductor material of the fins 10 operating as a growth seed. The top source/drain regions 46 may be doped to have the same conductivity type as the bottom source/drain region 30. In an embodiment, the top source/drain regions 46 and the bottom source/drain region 30 may be composed of the same semiconductor material (e.g., silicon). If the bottom source/drain region 30 is n-type, then the top source/drain regions 46 may be doped with a concentration of an n-type dopant from Group V of the Periodic Table (e.g., phosphorus (P) and/or arsenic (As)) that provides n-type electrical conductivity. Alternatively, if the bottom source/drain region 30 is p-type, then the top source/drain regions 46 may be doped with a concentration of a p-type dopant from Group III of the Periodic Table (e.g., boron (B), aluminum (Al), gallium (Ga), and/or indium (In)) that provides p-type electrical conductivity.

The resulting device structure is a vertical-transport field-effect transistor 50 that includes the bottom source/drain region 30, the top source/drain regions 46, the fins 10 that are arranged in the vertical direction between the bottom source/drain region 30 and the associated top source/drain region 46, and the gate stack 40. The gate stack 40 is arranged along the height of the fins 10 in the vertical direction between the bottom source/drain region 30 and the top source/drain regions 46. During operation, a vertical channel for vertical carrier transport is defined in a portion of each fin 10 overlapped by the gate stack 40 and carriers are vertically transported in the vertical channel between the bottom source/drain region 30 and the top source/drain regions 46.

Figure 13:
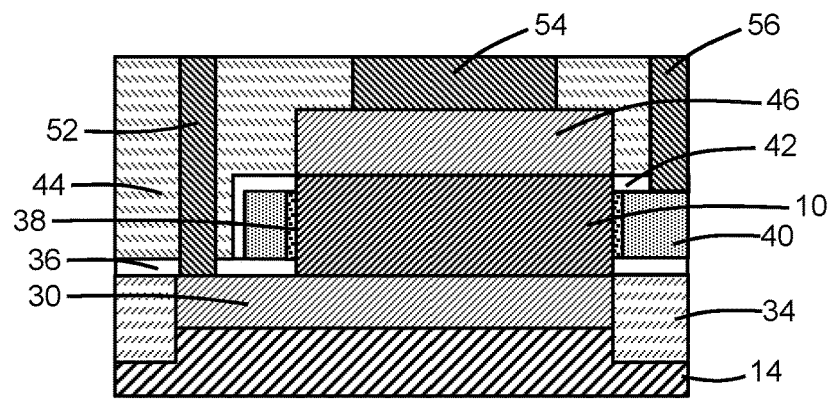

With reference to FIG. 13 in which like reference numerals refer to like features in FIG. 12 and at a subsequent fabrication stage, middle-of-line (MOL) processing and back-end-of-line (BEOL) processing follow, which includes formation of contacts and wiring for a local interconnect structure, and formation of dielectric layers, via plugs, and wiring for a BEOL interconnect structure coupled by the local interconnect structure with the vertical-transport field-effect transistor 50. Contacts 52, 54, 56 may be formed in a thickened dielectric layer 44 as conductive features of a local interconnect structure for the vertical-transport field-effect transistor 50. The contact 52 is aligned with the area 35 on the top surface of the bottom source/drain region 30 that is exposed by the fin cut, the contact 54 is aligned with one of the top source/drain regions 46, and the contact 56 is aligned with the gate stack 40.

Figure 14:
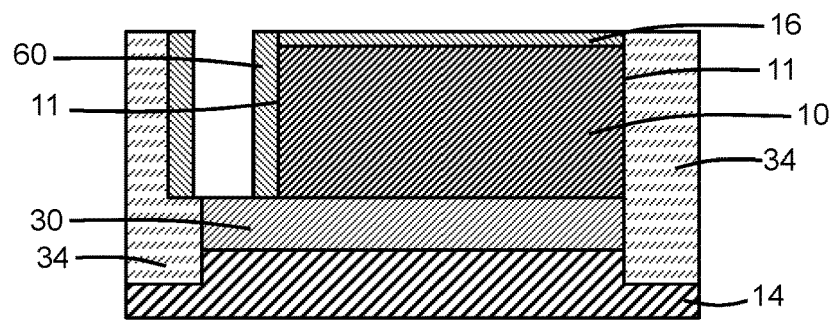
FIG. 14 is a cross-sectional view of a device structure in accordance with an alternative embodiment.

With reference to FIG. 14 in which like reference numerals refer to like features in FIG. 10 and at a subsequent fabrication stage in accordance with alternative embodiments, a dielectric spacer 60 may be formed on the end surface 11 of the fin 10 that is cut by the fin cut. The dielectric spacer 60 may be formed from a conformal dielectric layer (e.g., silicon nitride ($Si_3N_4$)) that is deposited and etched using an anisotropic etching process, such as a RIE process. The process flow proceeds as described in connection with FIGS. 11-13.

Figure 15:
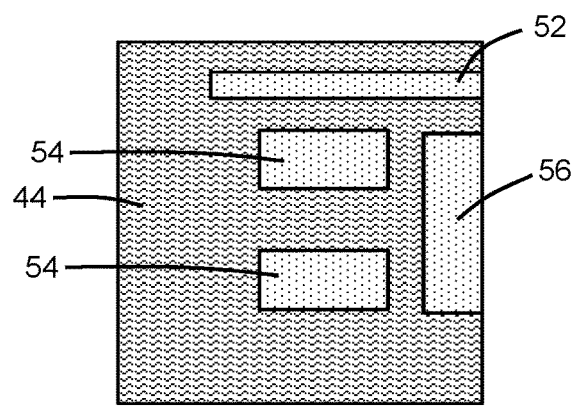
FIG. 15 is a top view of an arrangement of contacts for the device structure of FIG. 12 in accordance with an alternative embodiment.

With reference to FIG. 15 in which like reference numerals refer to like features in FIG. 12 and at a subsequent fabrication stage in accordance with alternative embodiments, the contact 52 to the bottom source/drain region 30 may be relocated to a position adjacent to the fins 10 and may be aligned parallel lengthwise with the fins 10. The exposed area 35 on the top surface of the bottom source/drain region 30 is arranged adjacent to one of the opposite sidewalls 13 of the fins 10. Because of the relocation of the contact 52, the fins 10 do not need to be trimmed by a fin cut to expose an area on the top surface of the bottom source/drain region 30. The contacts 54 and 56 may be formed without modification to their placement as shown in FIGS. 13 and 15.

Figure 16:
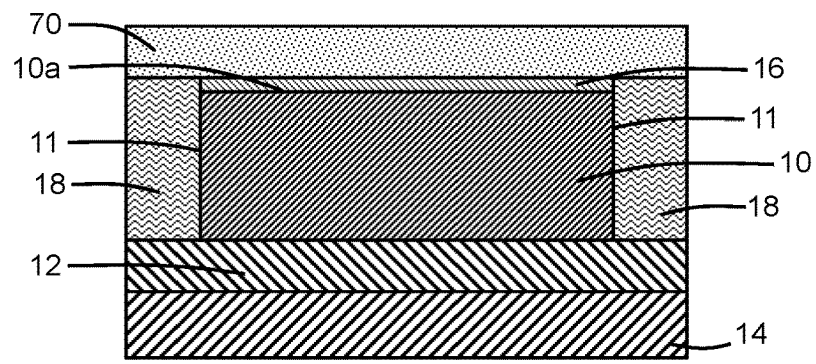
FIG. 16 is a cross-sectional view of a device structure at an initial fabrication stage of a processing method in accordance with embodiments of the invention.
Figure 16A:
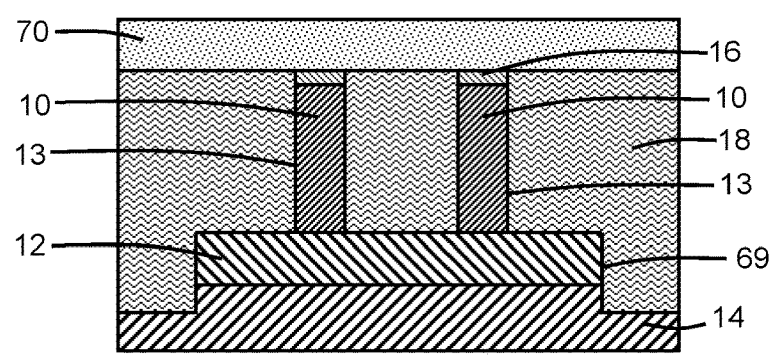
FIG. 16A is a cross-sectional view of the device structure of FIG. 16.
Figure 16B:
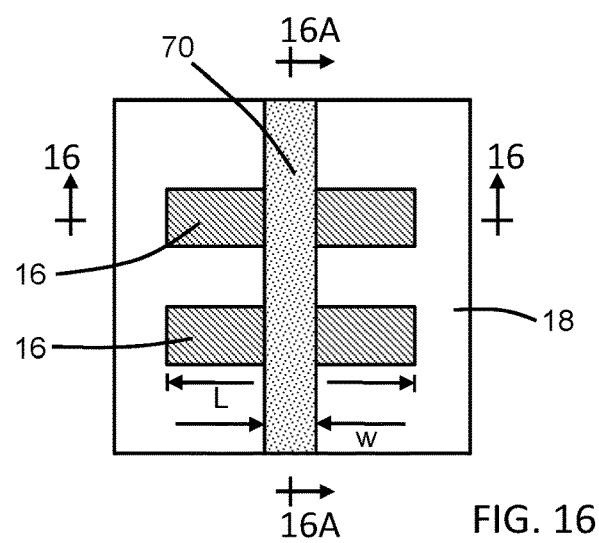

With reference to FIGS. 16, 16A, 16B in which like reference numerals refer to like features in FIG. 1, 1A, 1B and in accordance with alternative embodiments, the trench isolation layer 18 is formed over the fins 10 and sacrificial layer 12. Sections of the trench isolation layer 18 fill trenches 69 that extend through the sacrificial layer 12 and to a shallow depth into the substrate 14. Instead of forming the sacrificial layer 20, an etch mask 70 is formed that masks a strip on the top surface of the trench isolation layer 18. The etch mask 70 may include, for example, a bottom anti-reflective coating (BARC) layer, a spin-on hard mask, SiON, and/or a photoresist layer comprised of a photoresist material that is applied by a spin coating process, pre-baked, exposed to a radiation projected through a photomask, baked after exposure, and developed with a chemical developer to form a bar-shaped feature at an intended location for a dummy support structure to be formed from the trench isolation layer 18. In contrast with conventional process flows, the trench isolation layer 18 is not recessed relative to the fins 10 with an etch-back process. The etch mask 70 is arranged horizontally between the opposite end surfaces 11 of the fins 10.

Figure 17:
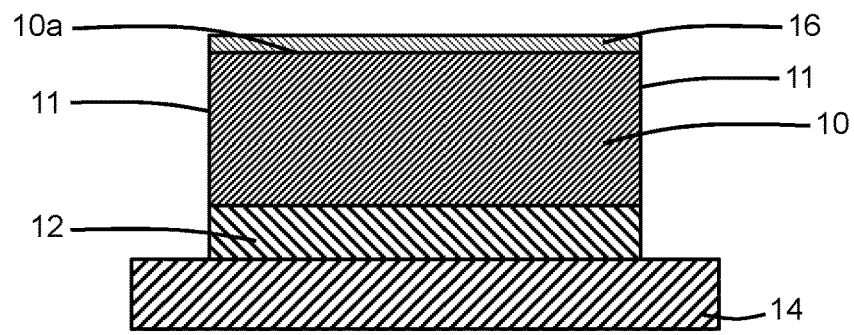
FIG. 17 is a cross-sectional view at a fabrication stage subsequent to FIG. 16.
Figure 17A:
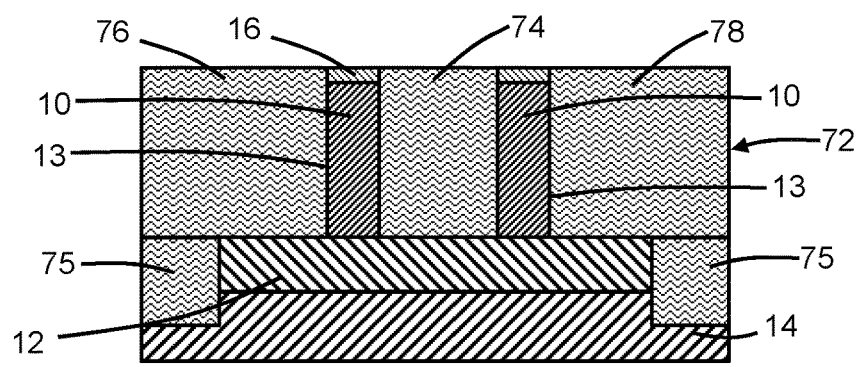
FIG. 17A is a cross-sectional view of the device structure of FIG. 17.
Figure 17B:
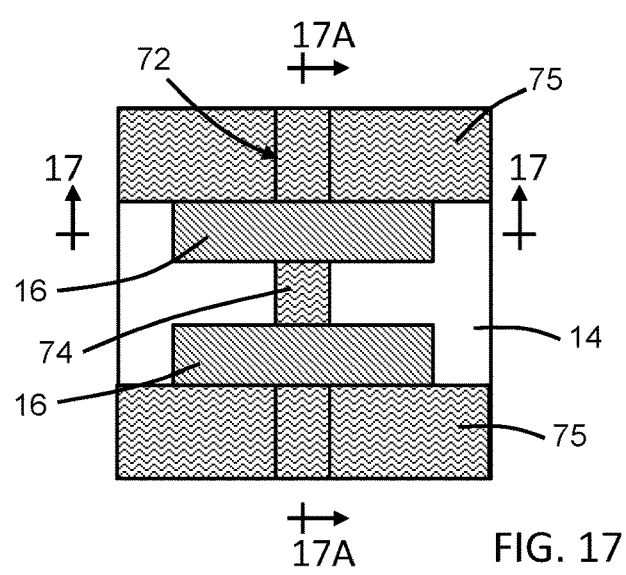

With reference to FIGS. 17, 17A, 17B in which like reference numerals refer to like features in FIGS. 16, 16A, 16B and at a subsequent fabrication stage, a support structure 72 is formed by patterning the partially-masked trench isolation layer 18 using an etching process that removes the material of the trench isolation layer 18 from areas on the sacrificial layer 12 that are not masked by the etch mask 70. The etching process may be a reactive-ion etching (RIE) process, and may remove the material of the trench isolation layer 18 selective to the materials of the dielectric caps 16, the fins 10, and the sacrificial layer 12. The etching process may be controlled such that sections of the trench isolation layer 18 remain in trenches in the sacrificial layer 12 and substrate 14 to define a trench isolation region 75 that surrounds a device region of the substrate 14 including the fins 10.

The support structure 72 includes a section 74 of the dielectric material of the trench isolation layer 18 that is arranged between the adjacent sidewalls 13 of the fins 10. The support structure 72 includes sections 76, 78 of the dielectric material of the trench isolation layer 18 that extend away from the sidewalls 13 of the fins 10 and overlap onto the trench isolation region 75. The sections of the trench isolation region 75 contacted by the sections 76, 78 of the support structure 72 are aligned parallel to the fins 10. The support structure 72 extends transverse to the length of the fins 10 between the opposite end surfaces 11, and functions to anchor the fins 10 during subsequent removal of the sacrificial layer 12. The support structure 72 has a width, w, that is less than the length, L, of the fins 10. In an embodiment that includes a single fin 10, the section 74 of the support structure 72 will be absent, the section 76 will extend from one of the sidewalls 13 of the fin 10 and the section 78 will extend from the opposite sidewall 13 of the fin 10. The support structure 72, which is arranged over the top surface 15 of the sacrificial layer 12, extends completely across the sacrificial layer 12. The support structure 72 extends above the top surface 10a of the fins 10.

Figure 17C:
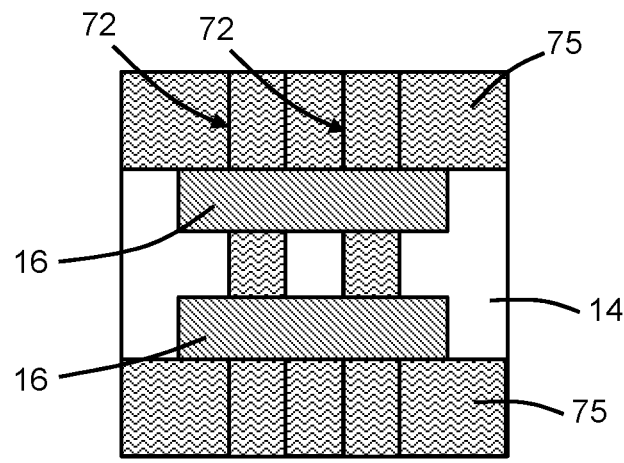
FIG. 17C is a top view similar to FIG. 17B of a device structure in accordance with alternative embodiments of the invention.

In alternative embodiments and as shown in FIG. 17C, multiple support structures 72 may be formed at spaced-apart locations along the length of the fins 10. The number of support structures 72 and their locations may be determined based upon, among other factors, the length, L, of the fins 10.

Figure 18:
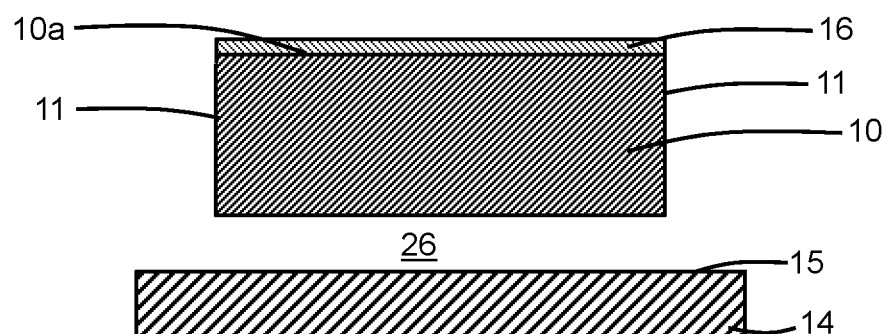
FIG. 18 is a cross-sectional view at a fabrication stage subsequent to FIG. 17.
Figure 18A:
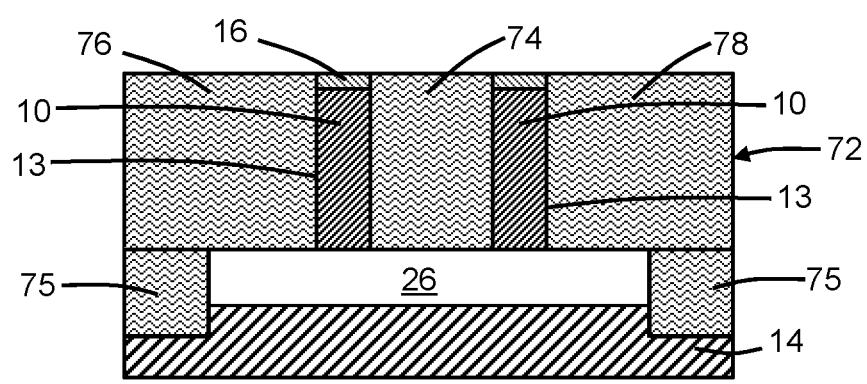
FIG. 18A is a cross-sectional view similar to FIG. 17A of the device structure of FIG. 18.

With reference to FIGS. 18, 18A in which like reference numerals refer to like features in FIGS. 17, 17A, 17B and at a subsequent fabrication stage, dielectric spacers 24 are formed at the sidewalls of the fins 10 as described in connection with FIGS. 5, 5A except over areas intersected by the support structure 72, but are not visible in FIGS. 18A, 18B due to the presence of the support structure 72. After the fins 10 are anchored using the support structure 72, the sacrificial layer 12 is completely removed with an etching process that etches the material constituting the sacrificial layer 12 selective to the materials constituting the fins 10, substrate 14, the support structure 72, and the trench isolation region 75. The removal of the sacrificial layer 12 forms the cavity 26 that extends completely beneath the fins 10 and that is arranged vertically between respective bottoms of the fins 10 and a top surface of the substrate 14. The dielectric caps 16 and dielectric spacers 24 enhance the protection provided to the fins 10 during the removal of the sacrificial layer 12.

The fins 10 are suspended from the trench isolation region 75 by the support structure 72 above (i.e., over) the cavity 26. The support structure 72, which anchors the fins 10, provides mechanical support and stability for the fins 10 at the sidewalls 13 after the cavity 26 is formed that undercuts the fins 10.

Figure 19:
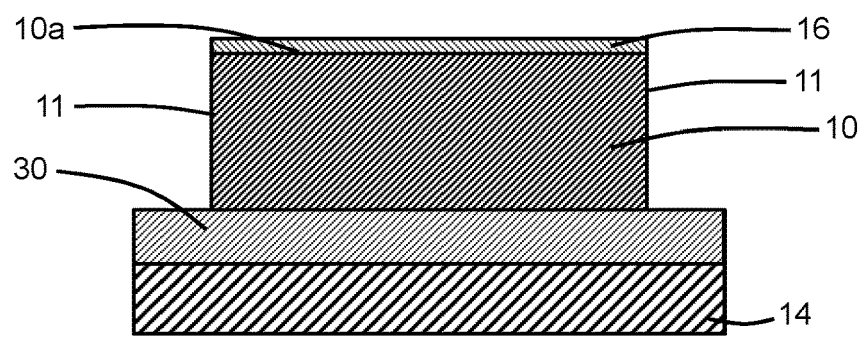
FIG. 19 is a cross-sectional view at a fabrication stage subsequent to FIG. 18.
Figure 19A:
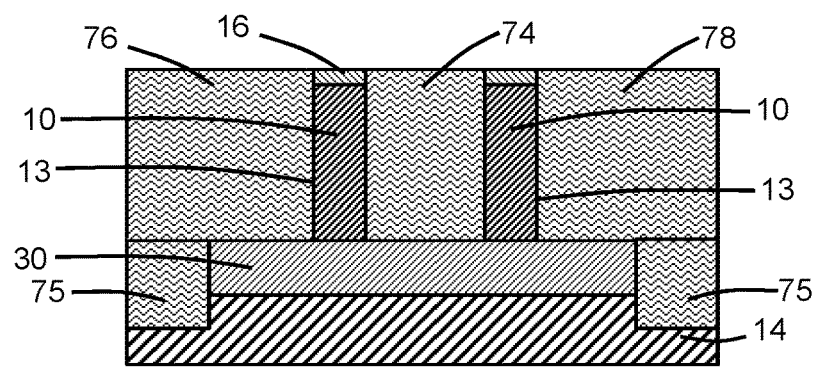
FIG. 19A is a cross-sectional view similar to FIG. 18A of the device structure of FIG. 19.

With reference to FIGS. 19, 19A in which like reference numerals refer to like features in FIGS. 18, 18A and at a subsequent fabrication stage, the bottom source/drain region 30 is epitaxially grown as described in connection with FIGS. 7, 7A.

Figure 20A:
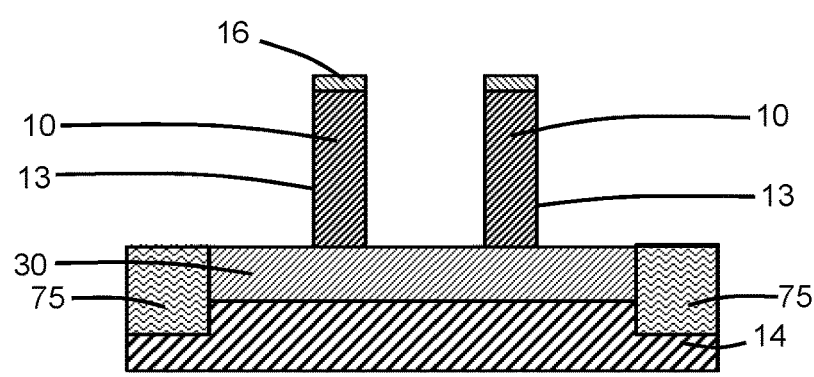
FIG. 20A is a cross-sectional view at a fabrication stage subsequent to FIG. 19A.

With reference to FIG. 20A in which like reference numerals refer to like features in FIG. 19A and at a subsequent fabrication stage, a dielectric layer (not shown) may be applied over the support structure 72 and polished to be coplanar with the dielectric caps 16 on the fins 10 such that the support structure 72 is embedded in the added dielectric layer. The added dielectric layer and the support structure 72 are subsequently etched back and removed from the trench isolation regions 18 and bottom source/drain region 30. The process flow continues as described in connection with FIGS. 11-13 to form the vertical-transport field-effect transistor 50.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a semiconductor fin over a sacrificial layer;
    forming a support structure connected with the semiconductor fin;
    after forming the support structure, removing the sacrificial layer to form a cavity extending beneath the semiconductor fin;
    epitaxially growing a semiconductor material in the cavity to form a source/drain region of a vertical-transport field-effect transistor;
    after epitaxially growing the semiconductor material in the cavity, forming a spacer layer on the source/drain region; and
    forming a gate dielectric layer and a gate stack over the spacer layer that overlap with a portion of the semiconductor fin.

2. The method of claim 1 wherein the support structure extends across the sacrificial layer.

3. The method of claim 1 wherein a trench isolation region extends through the sacrificial layer and into a trench in a substrate beneath the sacrificial layer, and the support structure extends horizontally from a first section of the trench isolation region across the sacrificial layer to a second section of the trench isolation region.

4. The method of claim 1 wherein the sacrificial layer has a top surface, and the support structure is arranged over the top surface of the sacrificial layer.

5. The method of claim 1 wherein the semiconductor fin has a top surface, and the support structure extends above the top surface of the semiconductor fin.

6. The method of claim 1 wherein the support structure includes a first section and a second section that is spaced from the first section, the semiconductor fin has a first end surface, a second end surface, and opposite sidewalls connected by the first end surface and the second end surface, and the first end surface and the second end surface of the semiconductor fin are arranged horizontally between the first section and the second section of the support structure.

7. The method of claim 1 wherein the support structure includes a first section and a second section that is spaced from the first section, the semiconductor fin has a first end surface, a second end surface, and opposite sidewalls connected by the first end surface and the second end surface, and the opposite sidewalls of the semiconductor fin are arranged horizontally between the first section and the second section of the support structure.

8. The method of claim 1 wherein the sacrificial layer is epitaxially grown on a substrate, the cavity is arranged vertically between the semiconductor fin and the substrate, and the semiconductor material is epitaxially grown inside the cavity using the substrate as a growth seed.

9. The method of claim 8 wherein the sacrificial layer is completely removed to form the cavity by an etching process that selectively removes the sacrificial layer relative to the substrate and the semiconductor fin.

10. The method of claim 1 wherein the sacrificial layer is epitaxially grown on a substrate, the sacrificial layer is composed of a silicon-germanium alloy, and the substrate and the semiconductor fin are composed of silicon.

11. The method of claim 1 wherein the semiconductor fin is suspended over the cavity by the support structure after the sacrificial layer is removed to form the cavity.

12. The method of claim 1 wherein the support structure is composed of a dielectric material.

13. A method comprising:
forming a semiconductor fin over a sacrificial layer;
forming a trench isolation layer over the semiconductor fin, the sacrificial layer, and a substrate beneath the sacrificial layer;
patterning the trench isolation layer to form a support structure connected with the semiconductor fin;
after forming the support structure, removing the sacrificial layer to form a cavity extending beneath the semiconductor fin; and
epitaxially growing a semiconductor material in the cavity to form a source/drain region of a vertical-transport field-effect transistor.

14. The method of claim 13 wherein the semiconductor fin includes a first sidewall and a second sidewall opposite to the first sidewall, and patterning the trench isolation layer to form the support structure comprises:
applying an etch mask on the trench isolation layer that masks a strip of the trench isolation layer,
wherein the etch mask is aligned transverse to the first sidewall and to the second sidewall of the semiconductor fin.

15. The method of claim 14 further comprising:
after applying the etch mask, selectively etching the trench isolation layer relative to the semiconductor fin and the sacrificial layer to form the support structure,
wherein the support structure is arranged on a first section and a second section of the trench isolation layer that are arranged in trenches in the substrate after selectively etching the trench isolation layer, and the first sidewall and the second sidewall of the semiconductor fin are arranged between the first section of the trench isolation layer and the second section of the trench isolation layer.

16. The method of claim 15 wherein the semiconductor fin is supported by the first section and the second section of the trench isolation layer when removing the sacrificial layer.

17. The method of claim 13 wherein the semiconductor fin includes a first end surface and a second end surface opposite to the first end surface, and the support structure includes a first section of the trench isolation layer adjacent to the first end surface of the semiconductor fin and a second section of the trench isolation layer adjacent to the second end surface of the semiconductor fin.

18. The method of claim 17 wherein patterning the trench isolation layer to form the support structure comprises:
depositing a dielectric material on the first section of the trench isolation layer and on the second section of the trench isolation layer; and
after the dielectric material is deposited, removing a third section of the trench isolation layer that is arranged vertically over the sacrificial layer and horizontally between the first section of the trench isolation layer and the second section of the trench isolation layer,
wherein the dielectric material masks the first section of the trench isolation layer and the second section of the trench isolation layer when removing the third section of the trench isolation layer.

19. A method comprising:
forming a semiconductor fin over a sacrificial layer;
forming a support structure connected with the semiconductor fin;
after forming the support structure, removing the sacrificial layer to form a cavity extending beneath the semiconductor fin; and
epitaxially growing a semiconductor material in the cavity to form a source/drain region of a vertical-transport field-effect transistor,
wherein the semiconductor fin has a first end surface and a second end surface, and the support structure is arranged horizontally between the first end surface and the second end surface of the semiconductor fin.

20. The method of claim 19 wherein the semiconductor fin includes a first sidewall and a second sidewall connected with the first sidewall by the first end surface and the second end surface, the support structure includes a first section and a second section, the first section of the support structure is positioned adjacent to the first sidewall of the semiconductor fin, and the second section of the support structure is positioned adjacent to the second sidewall of the semiconductor fin.

* * * * *